(12) United States Patent
Graham et al.

(10) Patent No.: US 8,580,691 B2
(45) Date of Patent: Nov. 12, 2013

(54) METHOD OF FORMING NON-PLANAR MEMBRANES USING CMP

(75) Inventors: Andrew B. Graham, Redwood City, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 126 days.

(21) Appl. No.: 13/232,012

(22) Filed: Sep. 14, 2011

(65) Prior Publication Data

US 2012/0264301 A1 Oct. 18, 2012

Related U.S. Application Data

(60) Provisional application No. 61/475,422, filed on Apr. 14, 2011.

(51) Int. Cl.
*H01L 21/302* (2006.01)
*H01L 21/461* (2006.01)

(52) U.S. Cl.
USPC ................. 438/692; 438/693; 216/89

(58) Field of Classification Search
USPC ................. 216/88, 89; 438/692, 693
See application file for complete search history.

(56) References Cited

U.S. PATENT DOCUMENTS

| | | | |
|---|---|---|---|
| 5,993,293 A * | 11/1999 | Cesna et al. | 451/41 |
| 6,664,126 B1 | 12/2003 | Devoe et al. | |
| 6,913,941 B2 | 7/2005 | O'Brien et al. | |
| 7,056,757 B2 | 6/2006 | Ayazi et al. | |
| 7,825,484 B2 | 11/2010 | Martin et al. | |
| 2003/0136759 A1 | 7/2003 | Mikolas | |
| 2010/0032775 A1 | 2/2010 | Morris, III et al. | |
| 2010/0295138 A1 | 11/2010 | Montanya Silvestre et al. | |

FOREIGN PATENT DOCUMENTS

JP 62083335 A 4/1987

OTHER PUBLICATIONS

International Search Report and Written Opinion in corresponding PCT Application (i.e., PCT/US2012/033471), completed Sep. 7, 2012 (8 pages).
Wagner, et al: "Microfabrication of complex surface topographies using grey-tone lithography", Sensors and Actuators A, Elsevier Sequoia S.A., Lausanne, CH, vol. 46, No. 1-3, Jan. 1, 1995, pp. 89-94, XP027205907, ISSN: 0924-4247 [retrieved on Jan. 1, 1995] the whole document (6 pages).

(Continued)

*Primary Examiner* — Roberts Culbert
(74) *Attorney, Agent, or Firm* — Maginot, Moore & Beck

(57) ABSTRACT

A method of shaping a substrate in one embodiment includes providing a first support layer, providing a first shaping pattern on the first support layer, providing a substrate on the first shaping pattern, performing a first chemical mechanical polishing (CMP) process on the substrate positioned on the first shaping pattern, and removing the once polished substrate from the first shaping pattern.

16 Claims, 6 Drawing Sheets

(56) References Cited

OTHER PUBLICATIONS

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).

Chen et al., "An Integrated Solution for Wafer-Level Packaging and Electrostatic Actuation of Out-of-Plane Devices," Paper from Stanford University, 2009, pp. 1071-1074, IEEE, USA (4 pages).

Chen, "Electrode Integrated Wafer-Level Packaging for Out-of-Plane MEMS Devices," Abstract Preview, International Microelectronics and Packaging Society, 2009, USA (1 pages).

Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).

Park et al., "Untraminiature encapsulated accelerometers as a fully implantable sensor for implantable hearing aids," Biomed Microdevices, 2007, Springer, USA (11 pages).

Web site publication, "Encapsulation for RF MEMS," http://micromachine.stanford.edu/~kuanlinc/Professional/Encapsulation%20for20%RF%20 . . . . Downloaded Apr. 1, 2011(4 pages).

* cited by examiner

METHOD OF FORMING NON-PLANAR MEMBRANES USING CMP

This application claims the benefit of U.S. Provisional Application No. 61/475,422, filed on Apr. 14, 2011.

FIELD OF THE INVENTION

This invention relates to substrates such as substrates used in forming micromechanical electrical system (MEMS) devices, microscale optical devices, or semiconductor devices.

BACKGROUND

Semiconductor substrates are used in a wide variety of applications. One such application is in the formation of micromechanical electrical system (MEMS) devices. As the need for increased complexity of the physical structure of MEMS devices has increased, a number of different shaping processes have been developed. Three major categories of shaping processes are bulk micromachining of silicon, surface micromachining, and deep reactive ion etching (DRIE). Each of these processes has unique benefits and capabilities. For example, DRIE processes provide very steep sidewalls which are useful in minimizing device footprint.

Typically, the processes used in shaping a substrate allow for highly complex shapes to be defined in the plane of the substrate. For example, circles, squares, and lines can be defined by processes such as lithography on a substrate surface and then etching processes can be used to remove material not covered by the lithographic layer. The shape of the substrate in a cross sectional plane, however, is constrained by the particular material removal process. Thus, DRIE provides substantially vertical sidewalls while chemical mechanical polishing (CMP) provides a substantially horizontal surface.

Curved shapes in the cross sectional plane, however, are less deterministic. For example, etching can be used to generate a curved shape. Control of the etching process, however, is difficult. Thus, precise location and shape of a curved sidewall using an etching process is problematic.

What is needed, therefore, is a method for providing a curved shape in a cross sectional plane of a substrate. A method that can be used to provide precisely positioned and dimensioned curved shapes in a cross sectional plane is also needed.

SUMMARY

A method of shaping a substrate in one embodiment includes providing a first support layer, providing a first shaping pattern on the first support layer, providing a substrate on the first shaping pattern, performing a first chemical mechanical polishing (CMP) process on the substrate positioned on the first shaping pattern, and removing the once polished substrate from the first shaping pattern.

In a further embodiment, a method of shaping a substrate includes providing a first shaping pattern on a first support layer, positioning a substrate on the first shaping pattern, performing a first chemical mechanical polishing (CMP) process on the substrate positioned on the first shaping pattern, generating first pressure at a first location on an upper surface of the substrate as a result of the first shaping pattern, generating a second pressure at a second location on the upper surface of the substrate as a result of the first shaping pattern, wherein the first pressure is greater than the second pressure, removing an increased amount of material from the first location compared to the second location, and removing the once polished substrate from the first shaping pattern.

DESCRIPTION

Figure 1:
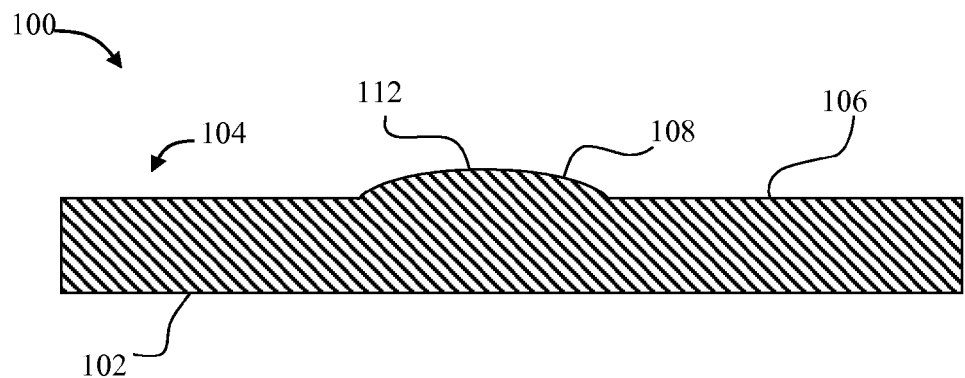
FIG. 1 depicts side cross sectional view of a substrate with a convexity formed on one side thereof.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

Figure 2:
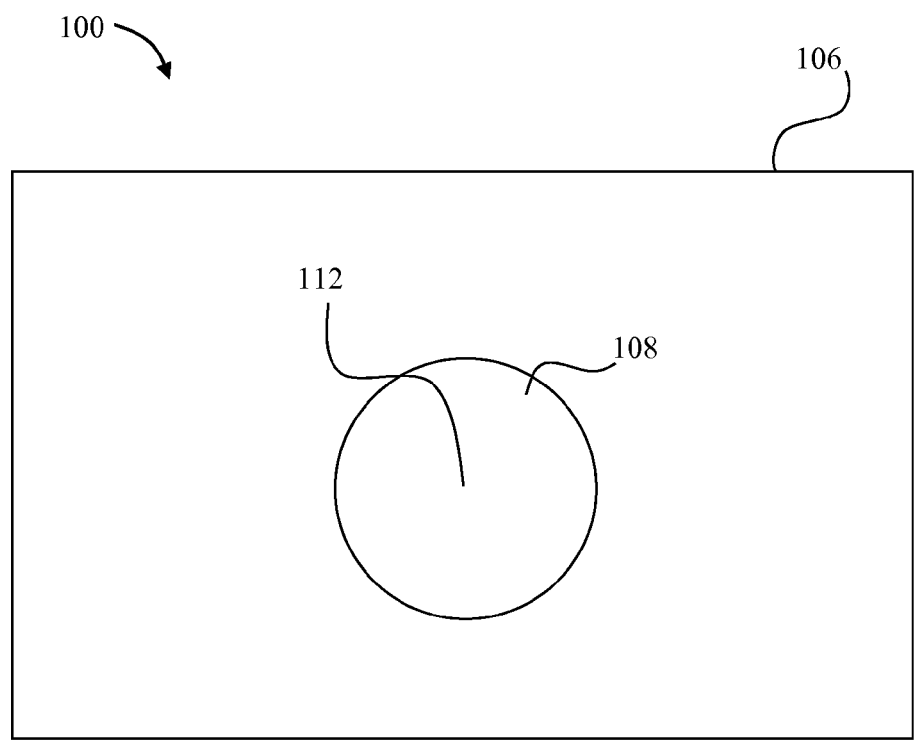
FIG. 2 depicts top plan view of the substrate of FIG. 1 showing the convexity surrounded by a planar area.

FIGS. 1 and 2 depict a substrate 100 which in this embodiment consists of a silicon material. The substrate 100 includes a lower surface 102 that is generally planar and an upper surface 104 which includes a planar surface portion 106 that is located about a thicker portion 108. The thicker portion 108 defines continuously curving profile when viewed in cross section (see FIG. 1) with an apex 112 that is centrally located.

Figure 3:
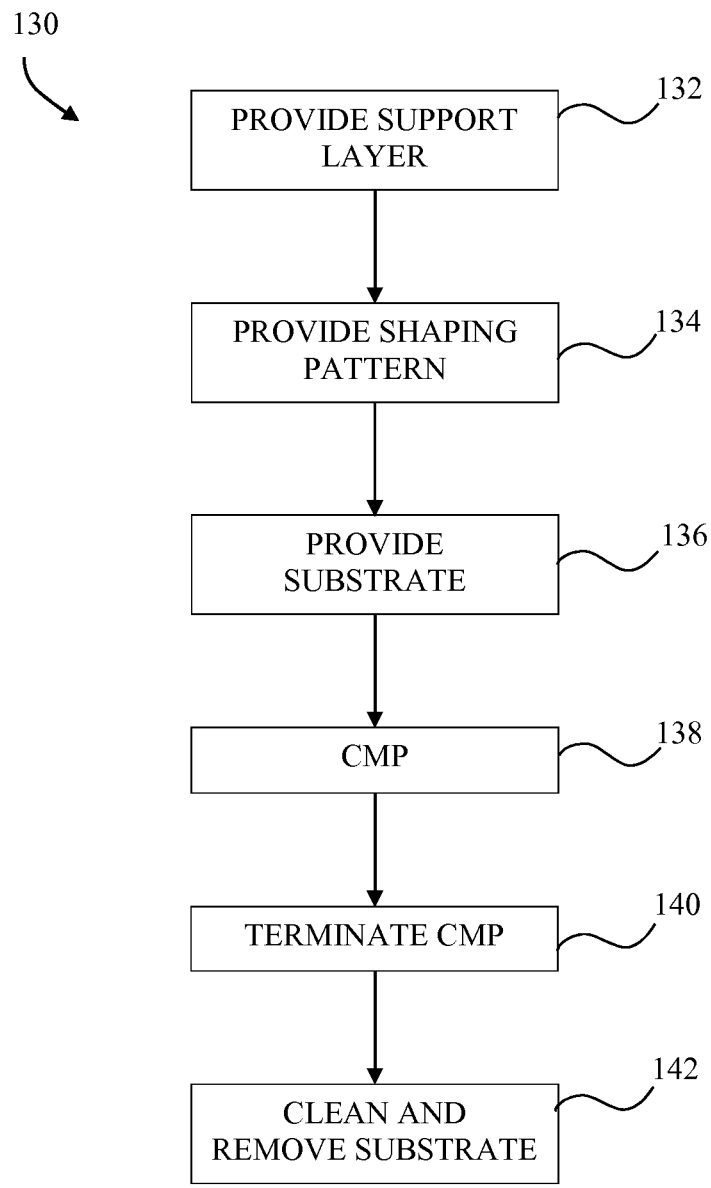
FIG. 3 depicts a flow diagram of a procedure that may be performed to shape a convexity or a concavity on a substrate.

The thicker portion 108 is formed using a process 130 depicted in FIG. 3. The process 130 begins by providing a support layer (block 132). In one embodiment, the support layer is a planar surface. A shaping pattern is then positioned on the support layer (block 134). The shaping pattern, which may be a shaping layer deposited on the support layer using any desired process such as lithography, is characterized by at least one area of shaping layer material that is thicker than an adjacent area as described more fully below. A substrate to be shaped is then placed on the shaping pattern defined in the shaping layer (block 136).

The assembled substrate, shaping layer, and support layer are then subjected to a chemical mechanical polishing (CMP) process (block 138). During CMP, the lower surface of the support layer is fully supported by the CMP device while a pressure is exerted on the upper surface of the substrate by a polishing pad of the CMP device. The upper surface of the substrate at locations directly between the thicker material (positive feature) of the shaping layer and the CMP polishing pad is thus subjected to an increased pressure while the upper surface of the substrate at locations directly between thinner portions of the shaping layer (negative features) are subjected to a lesser amount of pressure. Consequently, as CMP proceeds, more material is removed from the upper surface of the substrate that are directly above positive features and a lesser amount of material is removed from the upper surface of the substrate that are directly above negative features.

Once the desired amount of material has been removed from the upper surface of the substrate, the CMP is terminated (block 140) and the substrate is cleaned and removed from the shaping pattern. Because more of the substrate is removed from location directly above the positive features, those portions of the substrate are thinner than portions of the substrate above negative features of the shaping layer. Accordingly, thicker portions of the substrate, such as the thicker portion 108, may be obtained by CMP polishing. In some embodiments, the substrate may remain on the shaping pattern, thereby allowing for a defined chamber to be located beneath the thinner portion of the substrate.

Figure 4:
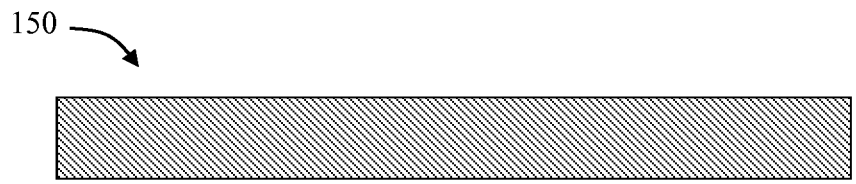
FIG. 4 depicts a side cross sectional view of a support layer provided in accordance with the procedure of FIG. 3.
Figure 5:
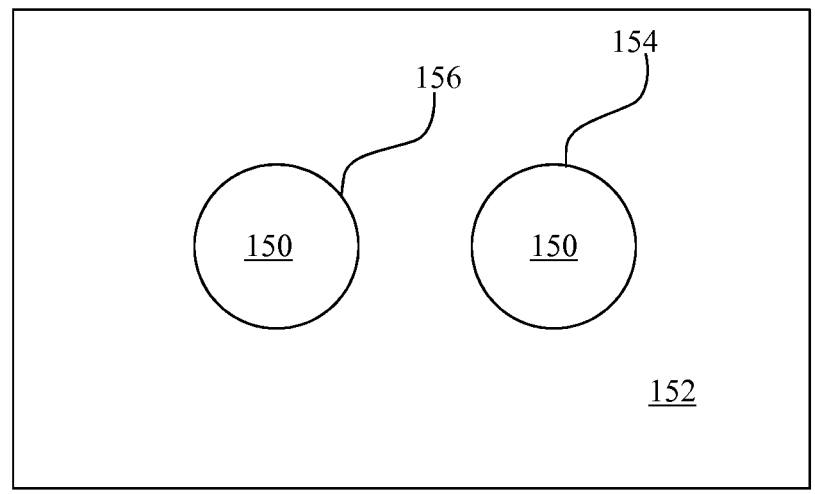
FIG. 5 depicts a top plan view of a shaping pattern on the substrate of FIG. 4 which includes two negative features in the shaping pattern.

FIGS. 4-8 depict a substrate shaped in accordance with the process 130 of FIG. 3. In FIG. 4, a support layer 150 is provided (block 132). A shaping layer 152 is then deposited on the support layer (block 134) as depicted in FIG. 5. The pattern of the shaping layer 152 defines two circles 154 and 156 through which the support layer 150 is visible. The circles 154 and 156 are thus negative features of the shaping layer 152 while the remainder of the shaping layer 152 is a positive feature.

Figure 6:
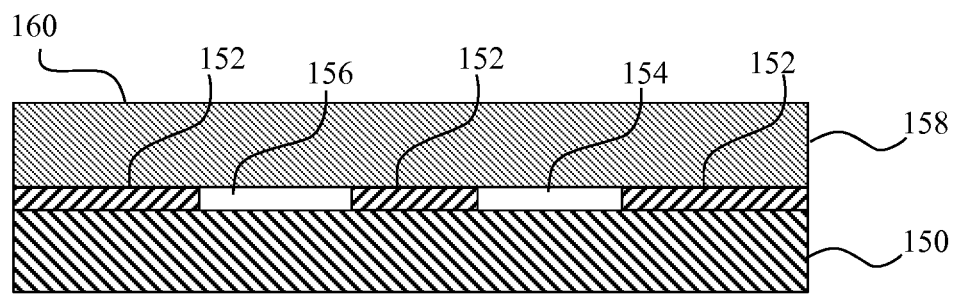
FIG. 6 depicts a side cross sectional view of a substrate positioned on the shaping pattern and support layer of FIG. 5.

A "positive feature" is thus a portion of the shaping layer 152 that has a thickness when viewed in cross section that is thicker in the z-plane (as depicted in FIG. 6) than an adjacent area of the shaping pattern 152. A "negative feature" is a portion of the shaping layer 152 that has a thickness when viewed in cross section that is thinner in the z-plane (as depicted in FIG. 6) than an adjacent area of the shaping pattern 152. A negative feature may thus be an area of the shaping layer 152 that is void of material or that is simply thinner than an adjacent area. If desired, a pattern may include a variety of thicknesses within a single shaping layer to provide a variety of substrate thicknesses after CMP. Accordingly, a feature that is "positive" with respect to one adjacent area may be "negative" with respect to another adjacent area.

While the shaping layer 152 is provided separately from the support layer in the embodiment of FIGS. 4-8, in some embodiments, the shaping pattern may be intrinsically formed with the support layer. By way of example, a substrate may be etched to form a support layer with an integral pattern.

Figure 7:
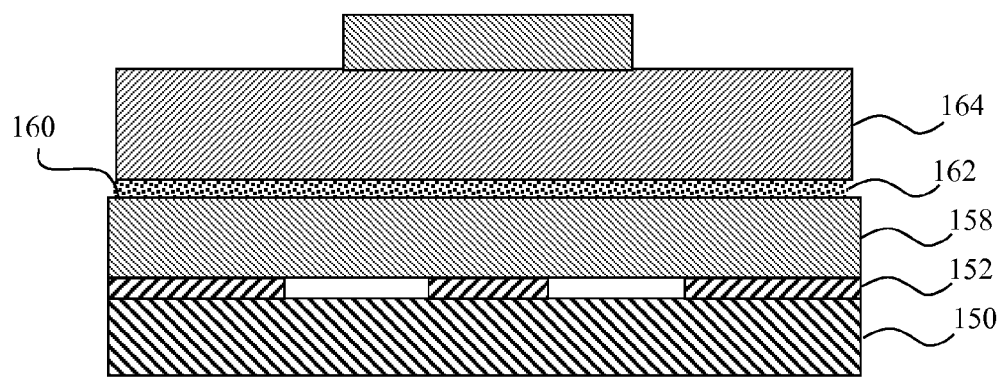
FIG. 7 depicts a polishing pad positioned above the substrate of FIG. 6.

Continuing with FIG. 6, once the shaping layer 152 is provided on the support layer 150, a substrate 158 is positioned on the shaping layer 152 (block 136). A CMP device is then used to polish the upper side 160 of the substrate 158 (block 138). Thus, as depicted in FIG. 7, a polishing slurry 162 is pressed against the upper side 160 using a polishing pad 164. In alternative embodiments, the polishing slurry 162 may be omitted.

Figure 8:
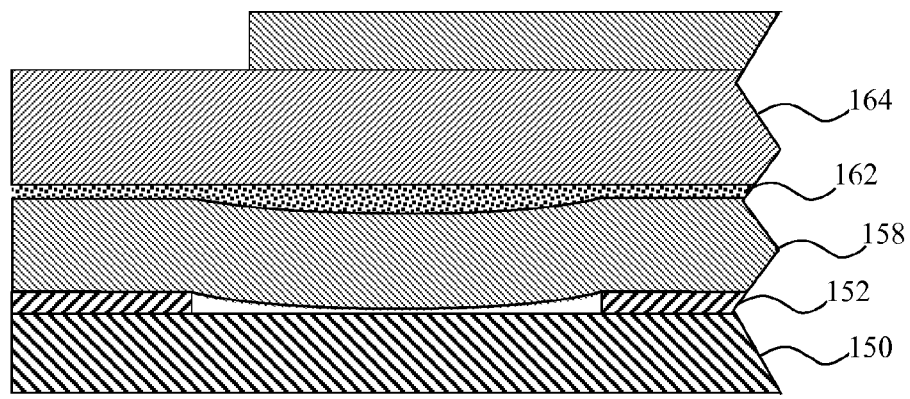
FIG. 8 depicts a partial side cross sectional view of the substrate of FIG. 7 being deflected by the polishing pad of FIG. 7 so as to provide an area of reduced material removal in the substrate of FIG. 7.

As the polishing pad 164 applies pressure, the unsupported area of the substrate 158, i.e., the portion directly above a negative feature of the shaping layer 152, moves away from the polishing pad 164 while the portion of the substrate 158 directly above the positive features of the shaping layer 152 is not allowed to move away from the pad 164 as depicted in FIG. 8. Accordingly, as the CMP process continues, more material is removed from the substrate 158 at the portion of the substrate 158 directly above the positive features and less material is removed from the substrate 158 in the unsupported areas of the substrate 158.

The amount of flexure of the substrate 158 will depend upon a variety of design parameters. Such parameters include the type of material used in forming the substrate 158, the thickness of the substrate, the temperature of the process, the pressure applied by the pad, etc. These parameters can be selected based upon the desired final shape of the substrate.

Figure 9:
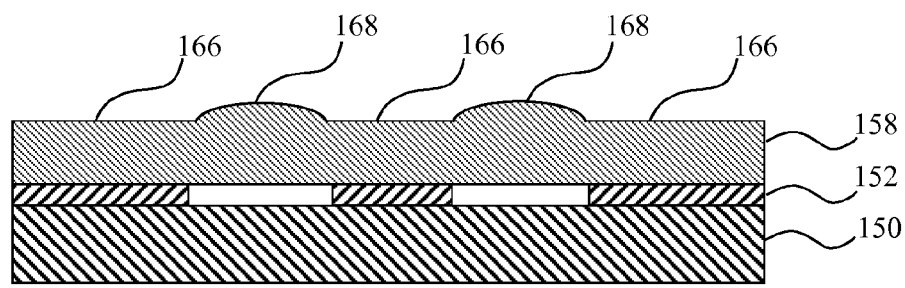
FIG. 9 depicts the substrate of FIG. 7 after CMP has been used to provide two convexities in the substrate.

Once the desired amount of CMP has been accomplished, CMP is terminated (block 140) resulting in the substrate configuration depicted in FIG. 9. The substrate 158 as depicted in FIG. 9 has a thickness along the z-axis in the planar portions 166 that is less than the thickness of the substrate 158 before CMP. The substrate 158 as depicted in FIG. 9 also has a thickness along the z-axis in the thicker areas 166 that is less than the thickness of the substrate 158 before CMP. Because less material was removed from the substrate 158 in the unsupported areas of the substrate 158, however, the thicker areas 168, which are located at positions corresponding to the negative features in the shaping layer 152, have a maximum thickness along the z-axis that is greater than the maximum thickness of the planar portions 166.

Figure 10:
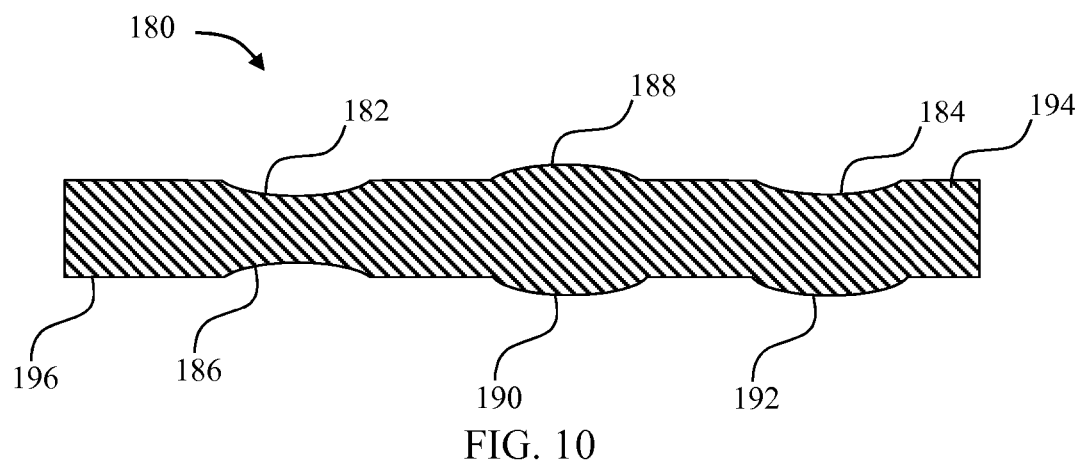
FIGS. 10 and 11 depict various concavities and convexities that may be created in a substrate using the procedure of FIG. 3.

By modification of the shape and thickness of the positive features 154 and the negative features 156, a number of differently shaped regions may be formed on a substrate. Additionally, both sides of a substrate may be polished in order to form a number of additional shapes. For example, FIG. 10 depicts a substrate 180 that includes concavities 182, 184, and 186. The substrate 180 further includes convexities 188, 190, and 192.

The concavities 182 and 184 and the convexity 188 may be formed during a CMP process performed on the upper side 194 of the substrate 180 while the concavity 186 and the convexities 190 and 192 may be formed during a second CMP process performed on the lower side 196 of the substrate 180. In obtaining a substrate 180 which is shaped on both the upper surface 194 and the lower surface 196, simply inverting the substrate 180 on a single shaping pattern will typically not be sufficient. For example, the concavity 182 is obtained as a result of a positive feature on a shaping layer that results in increased pressure at the location at which the concavity 182 is formed. If the substrate is inverted and the concavity 182 is aligned with that same positive feature, the positive feature will "fit" within the concavity 182 and the same increased pressure used to form the concavity 182 will not be generated. Thus, a larger positive feature is needed to obtain the increased pressure necessary for obtaining the concavity 186.

Figure 11:
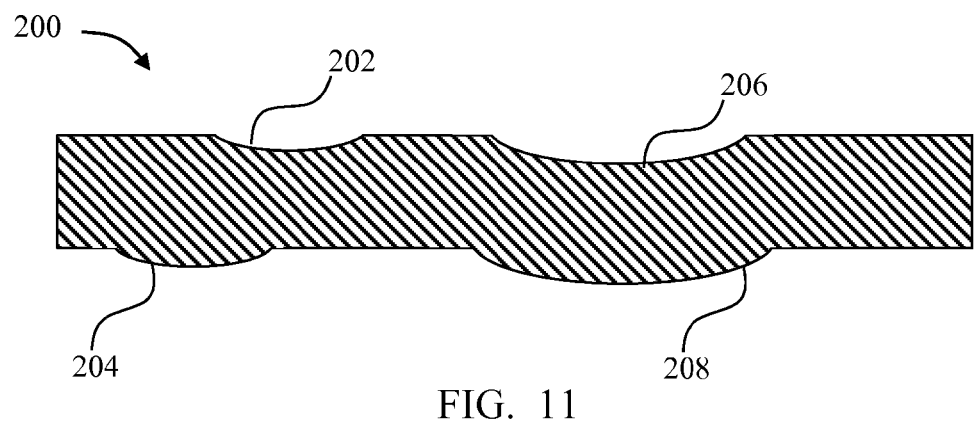

The ability to shape both sides of a substrate, while more complex than simply shaping a single side, allows for a variety of configurations to be realized. As depicted in FIG. 10, two concavities 182 and 186 are aligned, two convexities 188 and 190 are aligned, and the concavity 184 is aligned with the convexity 192. Additional configurations may also be obtained. As depicted in FIG. 11, a substrate 200 includes a concavity 202 that is offset from a convexity 204. Substrate 200 further includes a concavity 206 that is aligned with a convexity 208. The convexity 208, however, has a radius that is larger than the radius of the concavity 206. Thus, opposite sides of a substrate can be shaped to have a concavity paired with a complementary convexity, or with a complementary concavity. The concavity and/or convexity on opposing sides may be of the same or of different diameters. One or more of the concavities/convexities may be shaped differently, e.g., elongated.

Figure 12:
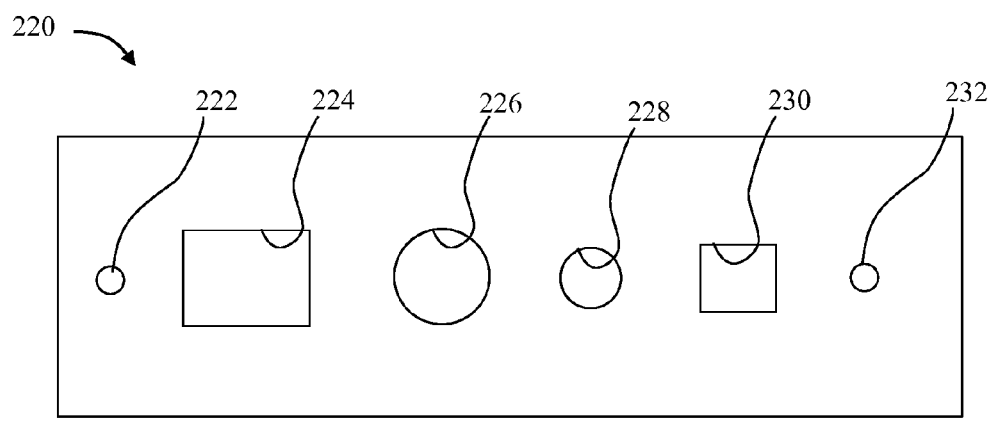
FIG. 12 depicts an integrally formed shaping pattern on a support layer including various positive and negative features that can be used to create concavities and convexities in a substrate.
Figure 13:
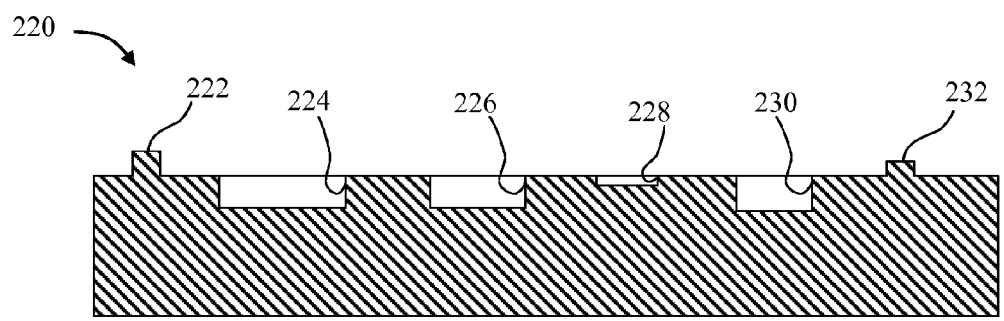
FIG. 13 depicts cross sectional plane view of the support layer of FIG. 12.

The concavities and convexities including those depicted in FIGS. 10-11, which in some embodiments are aligned while in others offset, can be formed in a variety of ways. For example FIGS. 12-13 depict a support substrate 220 with an integrally formed shaping pattern that includes cylindrical protuberances 222 and 232, rectangular cavities 224 and 230, and cylindrical cavities 226 and 228. The positive and negative features in the support substrate 220 will typically have a greater spacing than depicted in FIG. 12.

The shapes and configurations of the various positive and negative features in the support substrate 220 will provide different shaping abilities. The increased height of the cylindrical protuberance 222 as compared to the cylindrical protuberance 232 will result in a deeper concavity. The different widths of the cylindrical cavities 226 and 228 will result in convexities of different radius. The shallow cylindrical cavity 228 will restrict deflection of a substrate, resulting in a more subdued convexity. The rectangular cavities 224 and 230 will result in elongated convexities. These and other shapes may be used depending upon the desired shape.

Additionally, the process of FIG. 3 may be used to pattern a substrate which can then be used as a shaping layer for a subsequent substrate. For example, a cylinder such as the cylinder 222 of FIG. 13 may be patterned and used to form a concavity in a substrate. The concavity can then be used as a negative feature in a shaping layer to form a convexity. Accordingly, sidewalls that are curved in a cross sectional plane may be obtained either as a final configuration or as a negative or positive feature in a shaping layer.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of shaping a substrate comprising:
providing a first support layer;
providing a first shaping pattern on the first support layer;
providing a substrate on the first shaping pattern;
performing a first chemical mechanical polishing (CMP) process on the substrate positioned on the first shaping pattern;
removing the once polished substrate from the first shaping pattern;
providing a second support layer;
providing a second shaping pattern on the second support layer;
positioning the once polished substrate on the second shaping pattern;
performing a second CMP process on the once polished substrate positioned on the second shaping pattern; and
removing the twice polished substrate from the second shaping pattern.

2. The method of claim 1, wherein the substrate comprises a silicon based substrate.

3. The method of claim 1, wherein the shaping pattern comprises at least one void area.

4. The method of claim 1, wherein:
a first surface of the substrate is polished during the first CMP process; and
a second surface of the substrate is polished during the second CMP process.

5. The method of claim 4, wherein:
performing a first CMP process on the substrate comprises removing an increased amount of substrate material from a first substrate portion;
positioning the once polished substrate on the second shaping pattern comprises
aligning the first substrate portion with a positive feature of the second shaping pattern, and
positioning the first substrate portion on the positive feature; and
performing a second CMP process on the substrate comprises removing an increased amount of substrate material from a second substrate portion, the second substrate portion located on a portion of the substrate directly opposite to the first substrate portion.

6. The method of claim 1, wherein the first shaping pattern comprises:
at least one first positive feature; and
at least one first negative feature.

7. The method of claim 6, wherein the first shaping pattern comprises:
at least one second positive feature, the at least one first positive feature having a shape different from the shape of the at least one second positive feature.

8. The method of claim 6, wherein the first shaping pattern comprises:
at least one second positive feature, the at least one first positive feature having a thickness different from the thickness of the at least one second positive feature.

9. The method of claim 6, wherein the first shaping pattern comprises:
at least one second negative feature, the at least one first negative feature having a shape different from the shape of the at least one second negative feature.

10. The method of claim 6, wherein the first shaping pattern comprises:
at least one second negative feature, the at least one first negative feature having a thickness different from the thickness of the at least one second negative feature.

11. A method of shaping a substrate comprising:
providing a first shaping pattern on a first support layer, the first shaping pattern having at least one first negative feature surrounded by a first positive feature;
positioning a substrate on the first shaping pattern;
performing a first chemical mechanical polishing (CMP) process on the substrate positioned on the first shaping pattern;
generating first pressure at a first location on an upper surface of the substrate as a result of the first shaping pattern;
generating a second pressure at a second location on the upper surface of the substrate as a result of the first shaping pattern, wherein the first pressure is greater than the second pressure;
removing an increased amount of material from the first location compared to the second location; and
removing the once polished substrate from the first shaping pattern.

12. The method of claim 11, wherein the substrate comprises a silicon based substrate.

13. The method of claim 11, wherein the first shaping pattern comprises:
a second positive feature, the first positive feature having a shape different from the shape of the second positive feature.

14. The method of claim 11, wherein the first shaping pattern comprises:

a second positive feature, the first positive feature having a thickness different from the thickness of the second positive feature.

15. The method of claim 11, wherein the first shaping pattern comprises:
    at least one second negative feature, the at least one first negative feature having a shape different from the shape of the at least one second negative feature.

16. The method of claim 11, wherein the first shaping pattern comprises:
    at least one second negative feature, the at least one first negative feature having a thickness different from the thickness of the at least one second negative feature.

\* \* \* \* \*